US008524516B2

(12) United States Patent
Kang et al.

(10) Patent No.: US 8,524,516 B2
(45) Date of Patent: Sep. 3, 2013

(54) LIQUID CRYSTAL DISPLAY DEVICE AND FABRICATING AND DRIVING METHOD THEREOF

(75) Inventors: Hee Kwang Kang, Gwanak-gu (KR); Kyo Seop Choo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 13/085,666

(22) Filed: Apr. 13, 2011

(65) Prior Publication Data

US 2011/0187954 A1 Aug. 4, 2011

Related U.S. Application Data

(62) Division of application No. 11/386,773, filed on Mar. 23, 2006, now Pat. No. 7,944,429.

(30) Foreign Application Priority Data

Dec. 28, 2005 (KR) ........................ 10-2005-0132268

(51) Int. Cl.
*H01L 21/00* (2006.01)
*G02F 1/136* (2006.01)

(52) U.S. Cl.
USPC ................... 438/30; 438/24; 438/70; 349/43; 345/207

(58) Field of Classification Search
USPC ...................................................... 438/24, 30
See application file for complete search history.

(56) References Cited

U.S. PATENT DOCUMENTS

| | | | | |
|---|---|---|---|---|
| 4,462,041 | A * | 7/1984 | Glenn | 257/401 |
| 6,395,568 | B1 * | 5/2002 | Blish et al. | 438/17 |
| 6,831,710 | B2 * | 12/2004 | den Boer | 349/48 |
| 6,995,743 | B2 * | 2/2006 | Boer et al. | 345/104 |
| 7,023,503 | B2 * | 4/2006 | den Boer | 349/48 |
| 7,944,429 | B2 * | 5/2011 | Kang et al. | 345/102 |
| 2002/0024097 | A1 | 2/2002 | Joo | |
| 2002/0195954 | A1 | 12/2002 | Kim | |
| 2003/0103027 | A1 | 6/2003 | Kim et al. | |
| 2003/0137485 | A1 * | 7/2003 | Wei et al. | 345/102 |
| 2003/0205662 | A1 * | 11/2003 | Boer | 250/208.1 |
| 2003/0218116 | A1 * | 11/2003 | Boer | 250/208.1 |
| 2005/0176194 | A1 | 8/2005 | Sasaki et al. | |
| 2005/0231656 | A1 * | 10/2005 | den Boer et al. | 349/42 |
| 2005/0258341 | A1 | 11/2005 | Nishikawa et al. | |
| 2005/0280762 | A1 * | 12/2005 | Lee et al. | 349/141 |
| 2006/0279690 | A1 * | 12/2006 | Yu et al. | 349/199 |
| 2007/0146296 | A1 * | 6/2007 | Kang et al. | 345/102 |
| 2011/0187954 | A1 * | 8/2011 | Kang et al. | 349/46 |

FOREIGN PATENT DOCUMENTS

| | | |
|---|---|---|
| JP | 62-125329 | 6/1987 |
| JP | 3-249622 | 11/1991 |
| JP | 2000-122574 | 4/2000 |
| JP | 2001-111021 | 4/2001 |
| JP | 2003-131253 | 5/2003 |
| JP | 2005-070065 | 3/2005 |
| JP | 2005-070132 | 3/2005 |

* cited by examiner

*Primary Examiner* — David Vu
*Assistant Examiner* — Earl Taylor
(74) *Attorney, Agent, or Firm* — Morgan, Lewis & Bockius LLP

(57) ABSTRACT

A liquid crystal display device includes a liquid crystal panel divided into a non-display area and a display area where pixel cells are arranged in a matrix, a backlight for supplying light to the liquid crystal panel, and a photo-sensing device in the non-display area for sensing an external light to control light output from the backlight in accordance with the sensed the external light.

2 Claims, 16 Drawing Sheets

LIQUID CRYSTAL DISPLAY DEVICE AND FABRICATING AND DRIVING METHOD THEREOF

This application is a divisional application of application Ser. No. 11/386,773, filed on Mar. 23, 2006, now U.S. Pat. No. 7,944,429, which claims the benefit of Korean Patent Application No. P2005-0132268 filed on Dec. 28, 2005, which are hereby incorporated by reference in its entirety.

BACKGROUND OF THE INVENTION

1. Field of the Invention

The present invention relates to a display device, and more particularly to a liquid crystal display device, and fabricating and driving method thereof.

2. Description of the Related Art

A liquid crystal display (hereinafter referred to as "LCD") device controls light transmittance of liquid crystal cells in accordance with a video signal to display a picture. The LCD device utilizes an active matrix of cells in which a switching device is used in each cell. The LCD device can be configured for use in several different types of display devices, such as computer monitor, television monitor and cellular phone display. A thin film transistor (hereinafter referred to as "TFT") is mainly used as the switching device in the active matrix of the LCD device.

FIG. 1 represents a driving device of an LCD device of the related art. Referring to FIG. 1, the driving device of the LCD device of the related art includes a liquid crystal panel 152 where m×n number of liquid crystal cells Clc are arranged in an active matrix having m number of data lines D1 to DM crossing n number of gate lines G1 to Gn, and a TFT formed adjacent to each of the crossings; a data driver 64 for supplying a data signal to the data lines D1 to Dm of the liquid crystal panel 152; a gate driver 66 for supplying a scan signal to the gate lines G1 to Gn; a gamma voltage supplier 68 for supplying a gamma voltage to the data driver 64; a timing controller 60 for controlling the data driver 64 and the gate driver 66 using a synchronization signal supplied from a system 70; a DC/DC converter 74 for generating voltages supplied to the liquid crystal panel 52 from a voltage supplied by a power supplier 62; and an inverter 76 for driving a backlight 78. The system 70 supplies a vertical/horizontal synchronization signal Vsync, Hsync, a clock signal DCLK, a data enable signal DE and data RGB to the timing controller.

The liquid crystal panel 52 includes a plurality of liquid crystal cells Clc that are arranged in a matrix shape defined by the crossing of data lines D1 to Dm and gate lines G1 to Gn. A TFT is respectively formed in each of the liquid crystal cells Clc to switch the data signal from the data lines D1 to Dm in response to the scan signal supplied from the gate line G. Further, a storage capacitor Cst is formed in each of the liquid crystal cells Clc. The storage capacitor Cst is formed between the pre-stage gate line and the pixel electrode of the liquid crystal cell Clc, or formed between a common electrode line and the pixel electrode of the liquid crystal cell Clc, thereby fixedly sustaining the voltage of the liquid crystal cell Clc.

The gamma voltage supplier 68 supplies a plurality of gamma voltages to the data driver 64. The data driver 64 converts the digital video data RGB to an analog gamma voltage (data signal) corresponding to the gray level value in response to the control signal CS from the timing controller, and supplies the analog gamma voltage to the data lines D1 to Dm. The gate driver 66 sequentially supplies a scan pulse to the gate lines G1 to Gn in response to the control signal CS from the timing controller 60, thereby selecting a horizontal line of the liquid crystal panel 52 to which the data signal is supplied.

The timing controller 60 generates the control signal CS for controlling the gate driver 66 and the data driver 64 by use of the vertical/horizontal synchronization signal Vsync, Hsync and the clock signal DCLK which are inputted from the system 70. Herein, the control signal CS for controlling the gate driver 66 includes gate start pulse GSP, gate shift clock GSC, and gate output signal GOE. And the control signal CS for controlling the data driver 64 includes source start pulse GSP, source shift clock SSC, source output signal SOE, and polarity signal POL. The timing controller 60 also re-arranges the data RGB supplied from the system 70 for supply to the data driver 64.

The DC/DC converter 74 boosts or reduces the voltage of 3.3V input from the power supplier 62 and generates a voltage to be supplied to the liquid crystal panel 52. The DC/DC converter 72 generates a gamma reference voltage, a gate high voltage VGH, a gate low voltage VGL, and a common voltage Vcom.

The inverter 76 drives the backlight 78 by use of the drive voltage Vinv supplied from any one of the power supplier 62 or the system 70. The backlight 78 is controlled by the inverter 76 to generate light to supply to the liquid crystal panel 52.

In the liquid crystal display 52 of the liquid crystal display device of the related art, constant light is always supplied from the backlight 78 regardless of the amount of available light in the external environment. Thus, the backlight may provide insufficient lighting to the liquid crystal panel in a bright light environment or waste power in a low light environment. To solve these problems, a technique is proposed in that the external light is sensed by use of a photo-sensor, such as a photodiode, and the brightness of the backlight 18 is adjusted by a user's manipulation. However, the photo-sensor is not located within the liquid crystal panel 52 such that its reliability is decreased. Further, there is cost increase if the photo-sensor is separately added to the LCD device.

SUMMARY OF THE INVENTION

Accordingly, the present invention is directed to a liquid crystal display device and fabricating and driving method thereof that substantially obviates one or more of the problems due to limitations and disadvantages of the related art.

An object of the present invention to provide a liquid crystal display device that has reduced manufacturing cost, and fabricating and driving method thereof.

Another object of the present invention to provide a liquid crystal display device that has improved visibility and reducing power consumption, and fabricating and driving method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a liquid crystal display device according to an aspect of the present invention includes a liquid crystal display device includes a liquid crystal panel divided into a non-display area and a display area where pixel cells are arranged in a matrix, a backlight for supplying light to the liquid crystal panel, and a photo-sensing device in the non-display area for sensing an external light to control light output from the backlight in accordance with the sensed external light.

In another aspect, a fabricating method of a liquid crystal display device includes: forming a gate pattern having of a gate line and a first gate electrode of a thin film transistor connected to the gate line in a display area of a thin film transistor array substrate and a second gate electrode of a photo-sensing device in a non-display area of the thin film transistor array substrate; forming a gate insulating film on the gate pattern; forming a first semiconductor pattern of the thin film transistor and a second semiconductor pattern of the photo-sensing device on the gate insulating film; forming a source/drain pattern having a first source electrode and a first drain electrode connected to the first semiconductor pattern, second source electrodes and second drain electrodes connected to the second semiconductor pattern, and a data line crossing the gate line; forming a passivation film having a contact hole that exposes the first drain electrode of the thin film transistor; forming a pixel electrode that is connected to the first drain electrode through the contact hole; forming a color filter array substrate having a color filter array; and bonding the color filter array substrate and the thin film transistor array substrate with liquid crystal therebetween.

In yet another aspect, a driving method of a liquid crystal display device includes sensing an external light with a photo-sensing device formed on the thin film transistor array substrate and controlling a light output of a backlight supplied to the liquid crystal display device in accordance with the sensed result.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. With reference to FIGS. 2 to 12, embodiments of the present invention will be explained as follows.

Figure 1:
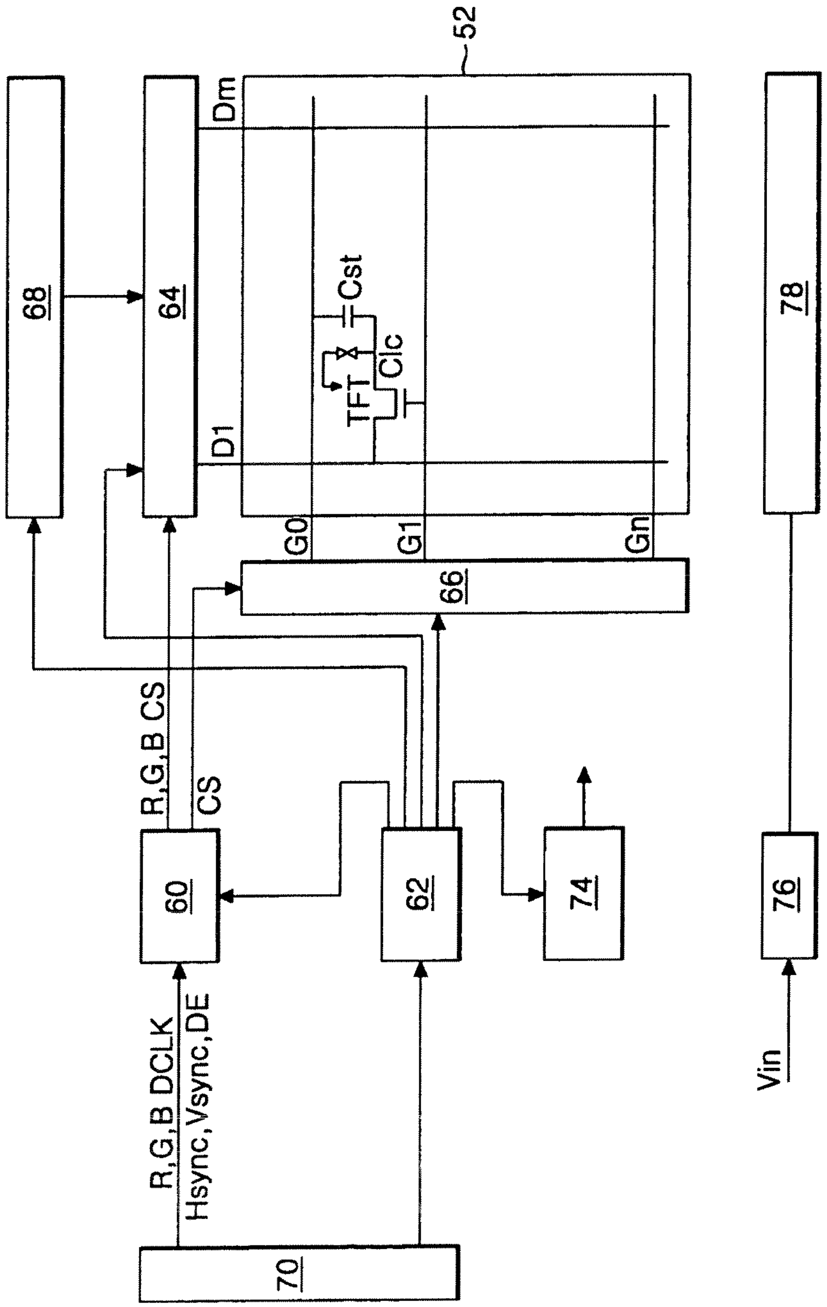
FIG. 1 RELATED ART
FIG. 1 is a diagram representing a driving device of a liquid crystal display device of the related art.
Figure 2:
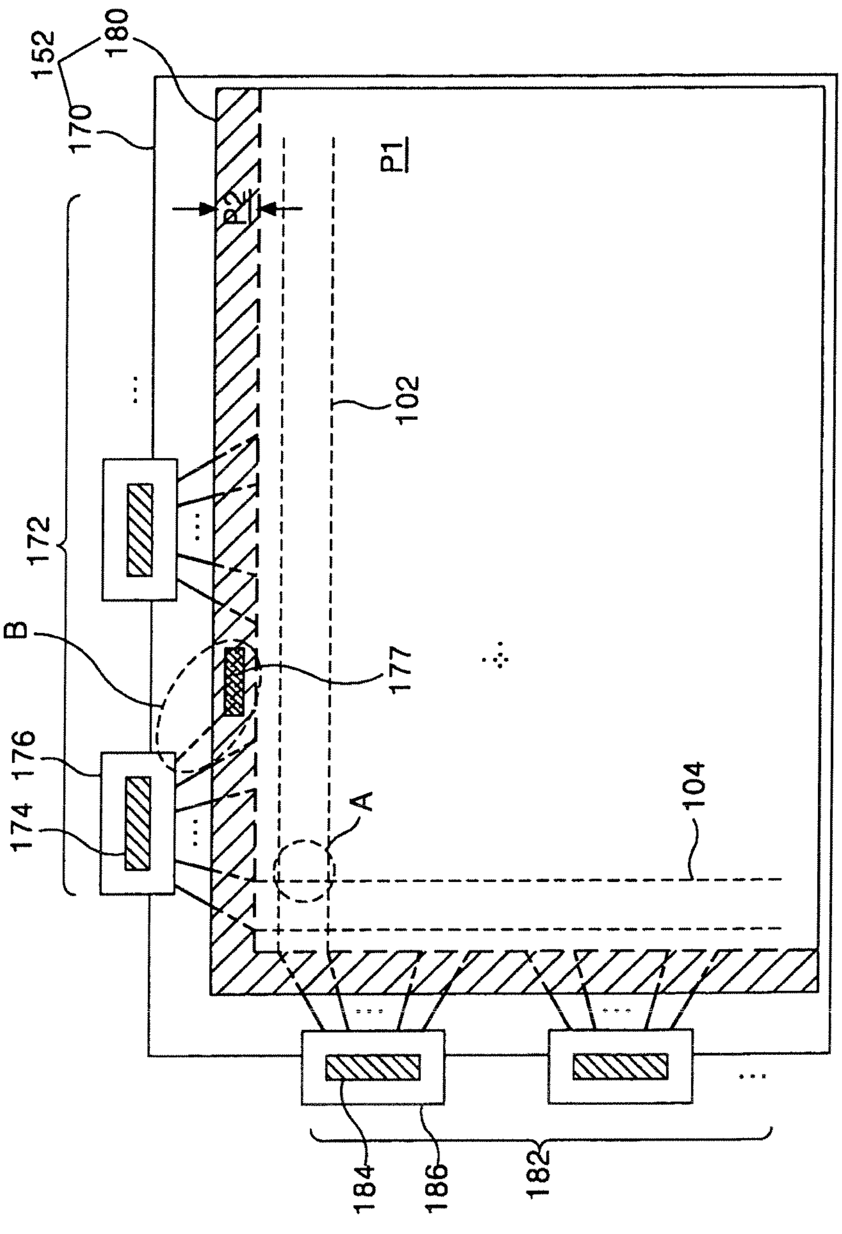
FIG. 2 is a diagram of a corner portion of a liquid crystal display device according to a first embodiment of the present invention.

FIG. 2 is a diagram of a corner portion of a liquid crystal display device according to a first embodiment of the present invention. The liquid crystal display (LCD) device shown in FIG. 2 has a photo-sensing device 177 formed on a thin film transistor array substrate 170 of a liquid crystal panel 152. Thus, a photo-sensor device, such as a separate photo diode, mounted outside of the thin film transistor substrate is not required so that the manufacturing cost of the LCD device can be reduced. The photo-sensing device 177 is formed within the liquid crystal panel 152, thereby improving the reliability of the photo-sensing device 177. Hereinafter, in reference to FIGS. 2 to 6, the configuration and operation of embodiments of the present invention will be described in detail.

As shown in FIG. 2, the LCD device includes a liquid crystal panel 152 having a thin film transistor array substrate 170 on which a thin film transistor array is formed, a color filter substrate 180 on which a color filter array is formed, a data driver 172 for supplying a data signal to the liquid crystal display panel 152, and a gate driver 182 for supplying a gate signal to the liquid crystal display panel 152. The thin film transistor array substrate 170 is bonded to the color filter substrate 180.

The gate driver 182 and the data driver 172 are integrated into the LCD device as a plurality of integrated circuits IC. That is to say, each gate driver 182 is integrated into gate integrated circuits 184 mounted on a gate TCP (tape carrier package) 186 connected to the liquid crystal panel 152 by a TAB (tape automated bonding) method, or mounted on the liquid crystal panel 152 by a COG (chip on glass) method. Each data driver 172 is integrated into data integrated circuits 174 mounted on the data TCP (tape carrier package) 176 connected to the liquid crystal panel 152 by a TAB (tape automated bonding) method, or mounted on the liquid crystal panel 152 by a COG (chip on glass) method. The integrated circuits 174 and 184 connected to the liquid crystal panel 152 by the TAB method through the TCP 176, 186 receive the control signals and DC voltages input from the outside through the signal lines mounted in PCB (printed circuit board) (not shown) connected to the TCPs 176 and 186 and are connected to each other.

The liquid crystal panel 152 includes a thin film transistor array substrate 170 having a gate line 102 and a data line 104 crossing each other to define a pixel cell. The gate line 102 is electrically connected to the gate integrated circuit 184 that drives the gate lines 102. And the data line 104 is electrically connected to the data drive IC 174 that drives the data line 104.

The liquid crystal panel 152 is divided into a display area P1 where a picture is realized and a non-display area P2. In the display area P1, the pixel cells (or liquid crystal cells) defined by the gate line 102 and the data line 104 are arranged in a matrix shape. In the non-display area P2, a photo-sensing device 177 is located in an area of the thin film transistor array substrate 170 that is not overlapped by either the gate line 102 or the data line 104.

Figure 3:
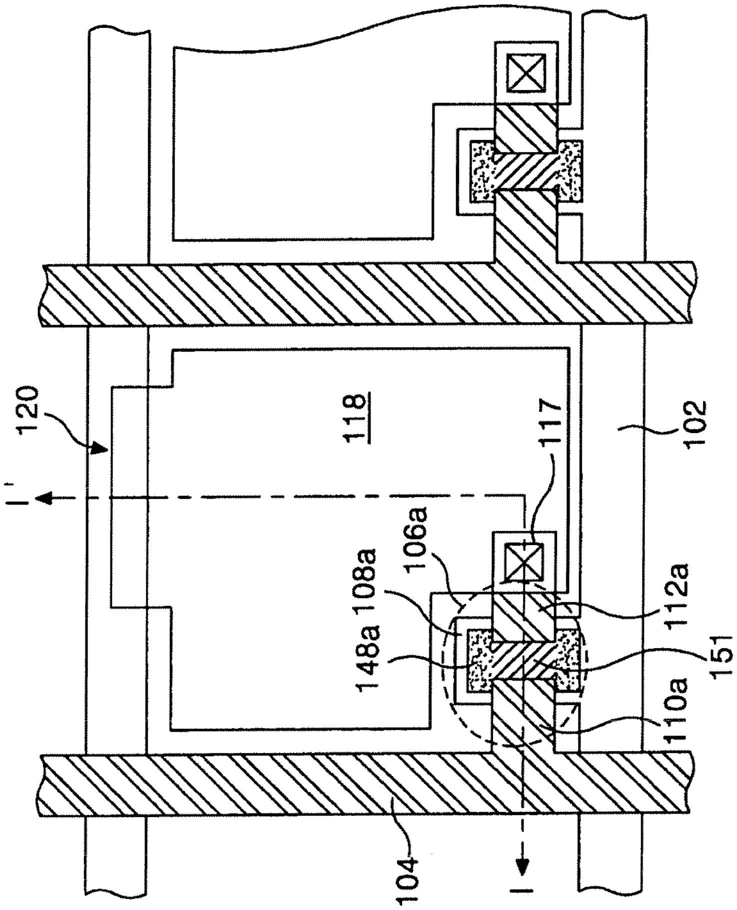
FIG. 3 is a plan of an area A in FIG. 2.
Figure 4:
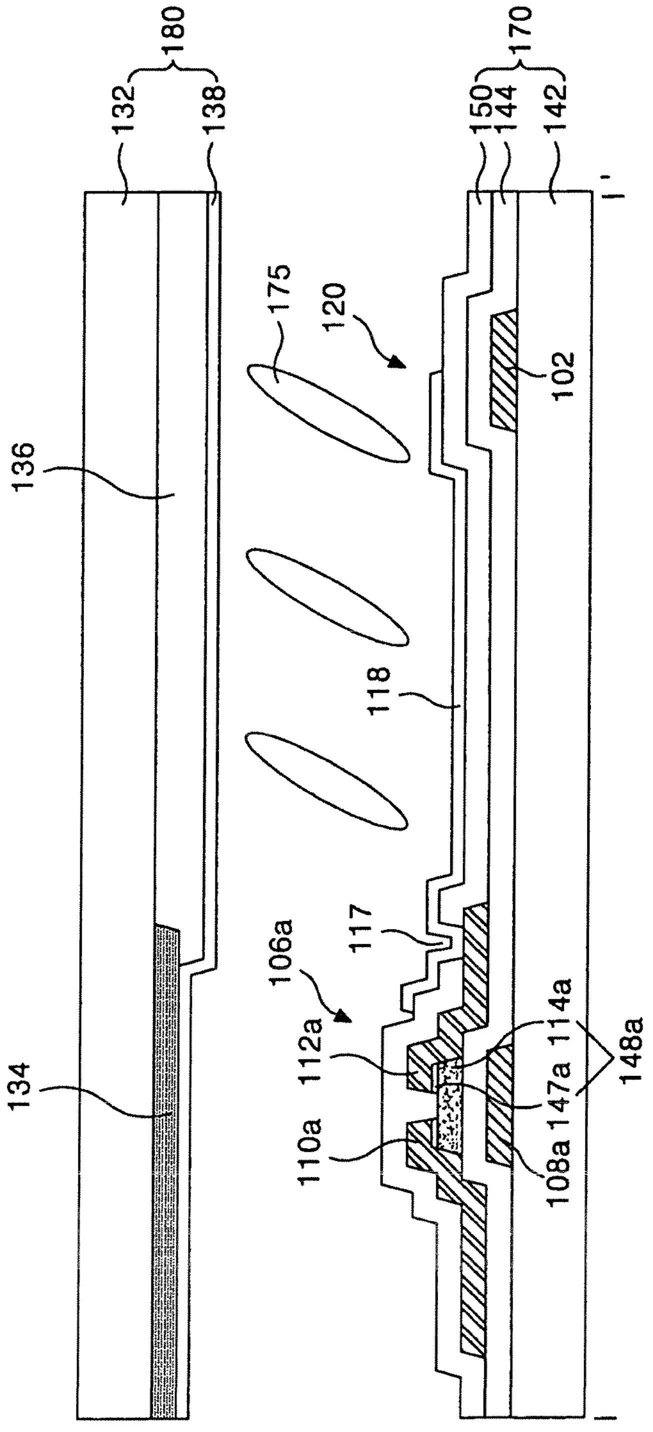
FIG. 4 is a cross-sectional view of the liquid crystal display device taken along line I-I' of FIG. 3.

FIG. 3 is a plan of an area A in FIG. 2. More particularly, FIG. 3 is a plan view of one pixel cell in a thin film transistor array substrate, and FIG. 4 is a cross-sectional view of the liquid crystal display device along the line I-I' of FIG. 3. For the sake of convenience, FIG. 3 only shows the thin film transistor array substrate, and FIG. 4 shows both the thin film transistor array substrate and the color filter array substrate. Referring to FIGS. 3 and 4, each of the pixel cells are arranged in a matrix shape within the display area P1. The color filter array substrate 180 is bonded to the thin film transistor array substrate 170 with the liquid crystal 175 therebetween. Each of the pixel cells have a color filter 136 on the color filter array substrate 180 and a pixel electrode 118 on the thin film transistor array substrate 170 with the liquid crystal 175 between the color filter 136 and the pixel electrode 118.

The thin film transistor array substrate 170 includes a gate line 102 and a data line 104, which are formed to cross each other and have a gate insulating film 144 therebetween; a thin film transistor 106A formed at each of the crossings; the pixel electrode 118 formed in a pixel area defined by the crossings; and a storage capacitor 120 formed where the pixel electrode 118 and a pre-stage gate line 102 overlap.

The thin film transistor 106*a* includes a first gate electrode 108*a* connected to the gate line 102, a first source electrode 110*a* connected to the data line 104, a first drain electrode 112*a* connected to the pixel electrode 118, an active layer 114*a*, which overlaps the first gate electrode 108*a* and forms a channel between the first source electrode 110*a* and the first drain electrode 112*a*. The active layer 114*a* partially overlaps the first source electrode 110*a* and the first drain electrode 112*a* and further includes a channel part between the first source electrode 110A and the second drain electrode 112*a*. A first ohmic contact layer 147*a* for being in ohmic contact with the first source electrode 110*a* and the second drain electrode 112*a* is further formed on the first active layer 114*a*. Herein, the first active layer 114*a* and the first ohmic contact layer 147 are called a first semiconductor pattern 148*a*.

The thin film transistor 106*a* transmits the pixel voltage signal charged and maintained on the data line 104 in response to the gate signal supplied to the gate line 102. The pixel electrode 118 is connected to the first drain electrode 112*a* of the thin film transistor 106*a* through the contact hole 117 that penetrates a passivation film 150. The pixel electrode 118 generates a potential difference with a common electrode 138 in response to receiving the charged pixel voltage. The potential difference causes a liquid crystal 175 located between the thin film transistor array substrate 170 and the upper substrate 132 to rotate by dielectric anisotropy, thereby transmitting incident light through the LCD device.

The storage capacitor 120 includes the pre-stage gate line 102 and the pixel electrode 118, which overlaps the gate line 102 with the gate insulating film 144 and the passivation film 150 therebetween. The storage capacitor 120 stably maintains the pixel voltage charged in the pixel electrode 118 until the next pixel voltage is received.

The color filter array substrate 180 includes a black matrix 134 bounding a pixel cell area on the upper substrate 132, a color filter 136 which is divided by the black matrix 134 and faces the pixel electrode 118 of the thin film transistor array substrate 170, and the common electrode 138 on the entire surface of the color filter 136 and the black matrix 134. The black matrix 134 is formed on the upper substrate 132 corresponding to the gate lines 102 and the data line 104, and provides defines a cell area where the color filter 136 is to be formed. The black matrix 134 prevents light leakage and absorbs the external light to increase contrast ratio. The color filter 136 is formed in a cell area defined by the black matrix 134 and corresponds to the pixel electrode 118 of the thin film transistor array substrate 170. The color filter 136 is formed for each of red, green and blue colors to realize a color display. The common electrode 138 is formed over the entire surface of the upper substrate 132 where the color filter 136 is formed for making a vertical electric field with the pixel electrode 118. On the thin film transistor array substrate 170 and the color filter array substrate 180, alignment films (not shown) are further formed and a cell gap is sustained by a spacer (not shown).

Figure 5:
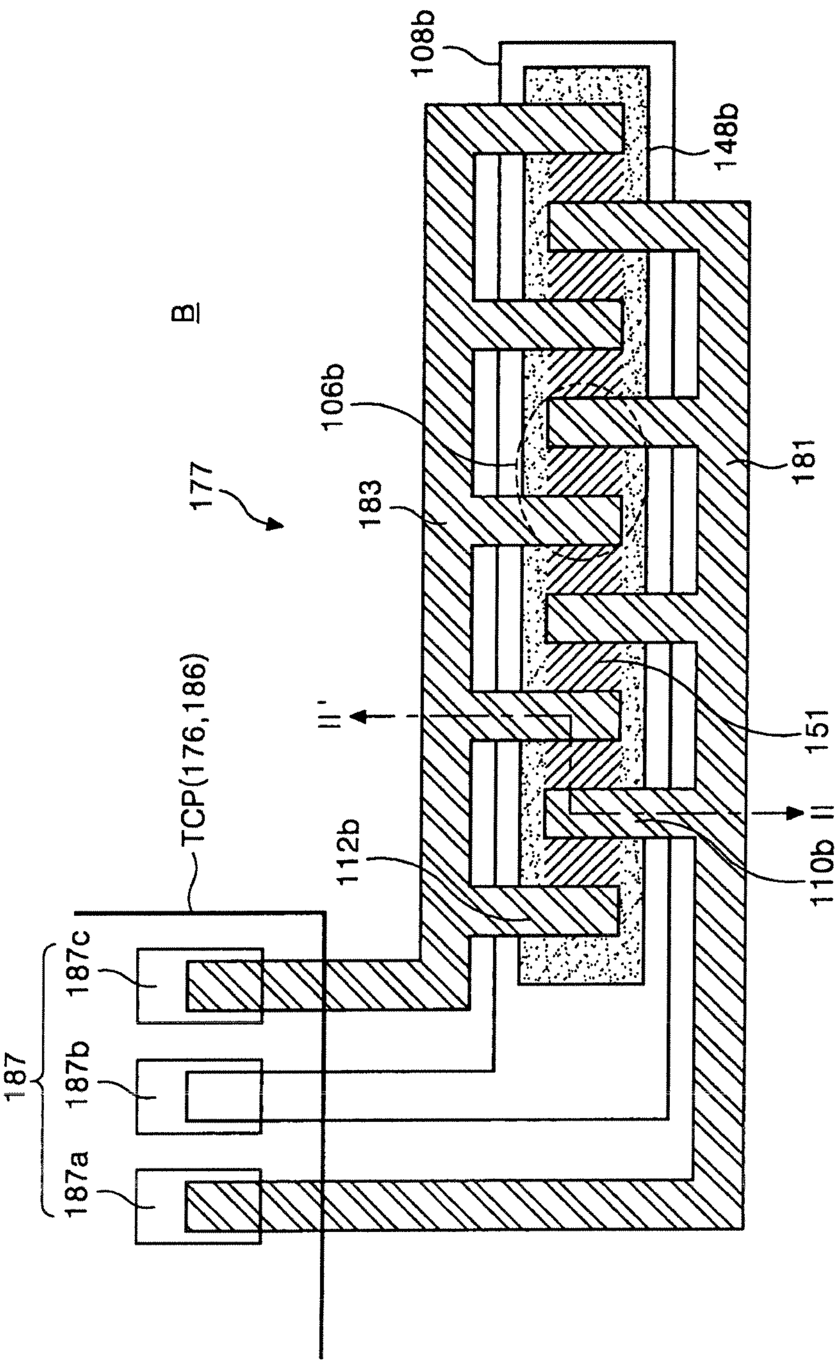
FIG. 5 is a plan view of area B in FIG. 2.
Figure 6:
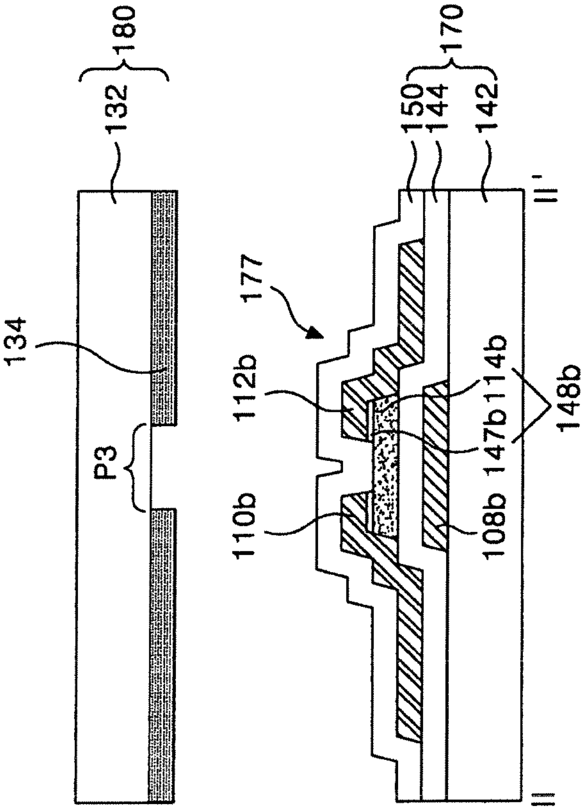
FIG. 6 is a cross-sectional view of the liquid crystal display device along the line II-II' of FIG. 5.

FIG. 5 is a plan view of area B of FIG. 2. More particularly, FIG. 5 is a plan view of a photo-sensing device 177 located in a non-display area P2 of a liquid crystal panel 152. FIG. 6 is a cross-sectional view of the liquid crystal display device along line II-II' of FIG. 5. For the sake of convenience, FIG. 5 only shows the thin film transistor array substrate, and FIG. 6 both the thin film transistor array substrate and the color filter array substrate.

The photo-sensing device 177 includes a second gate electrode 108*b* connected to a first output pad 187*b* of the TCP 176, 186, a gate insulating film 144 formed to cover the second gate electrode 108*b*; a second semiconductor pattern 148*b* having an active layer 114*b* and a second ohmic contact layer 147*b* that overlaps the second gate electrode 108*b* with the gate insulating film 144 therebetween, second source electrodes 110*b* and second drain electrodes 112*b* that face each other with a channel of the second semiconductor pattern 148 therebetween; a source line 181 connected to the second source electrodes 110*b* and to a second output pad 187*a* of the TCP 176; and a drain line 183 that is connected to the second drain electrodes 112B and a first input pad 187*c* of the TCP 176, 186.

A first drive voltage is supplied to the second gate electrode 108*b* through the first output pad 187*b* of the TCP 176, 186 from a separate voltage source for driving the photo-sensing device 177. The source line 181 also receives a second drive voltage from a separate voltage source through the second output pad 187*a* of the TCP for driving the photo-sensing device 177. The drain line 183 supplies the voltage sensed by the photo-sensing to the first input pad 187*c* of the TCP 176, 186. The second source electrodes 110*b* are formed to extend from the source line 181 so as to face the drain line 183, and the second drain electrode 112*b* is formed to extend from the drain line 183 so as to face the source line 181. The second source electrodes 110*b* and the second drain electrodes 112*b* are interleaved and have channels 151 in between. The photo-sensing device 177 in embodiments of the present invention has a structure in which a plurality of parallel connected thin film transistors 106*b* are configured to commonly share the second gate electrode 108*b*, second drain electrodes 112*b*, second source electrodes 110*b* and the second semiconductor pattern 148*b* such that their channels 151 acts as a light receiving part of a photo-sensing device 177.

The black matrix 134 formed in the color filter array substrate 180 which faces the photo-sensing device 177 exposes the channels 151 of the photo-sensing device 177. Thus, the black matrix 134 has an opening at light receiving area P3 that corresponds to the light receiving part of the photo-sensing device 177. Accordingly, the external light can irradiate the photo-sensing device 177 through the light receiving area P3 of the color filter array substrate 180 so that the photo-sensing device 177 can sense the amount of the external light. Hereinafter, the process that the photo-sensing device 177 senses the external light will be explained.

A path of photo current flows to the second drain electrodes 112*b* through the channels 151 from the second source electrodes 110*b* of the photo-sensing device 177 in accordance with the received light amount if a first drive voltage Vdrv, e.g., a voltage of about 10V, is applied to the source electrode 110*b* through the source line 181 of the photo-sensing device 177, a second drive voltage Vbias, e.g., a reverse bias voltage of about −5V, is applied to the second gate electrode 108B of the photo-sensing device 177, and light is received in the channel 151 area of the photo-sensing device 177. The voltage by the photo current path is supplied to the first input pad 187*c* through the second drain electrode 112*b* of the photo-sensing device 177.

Figure 7:
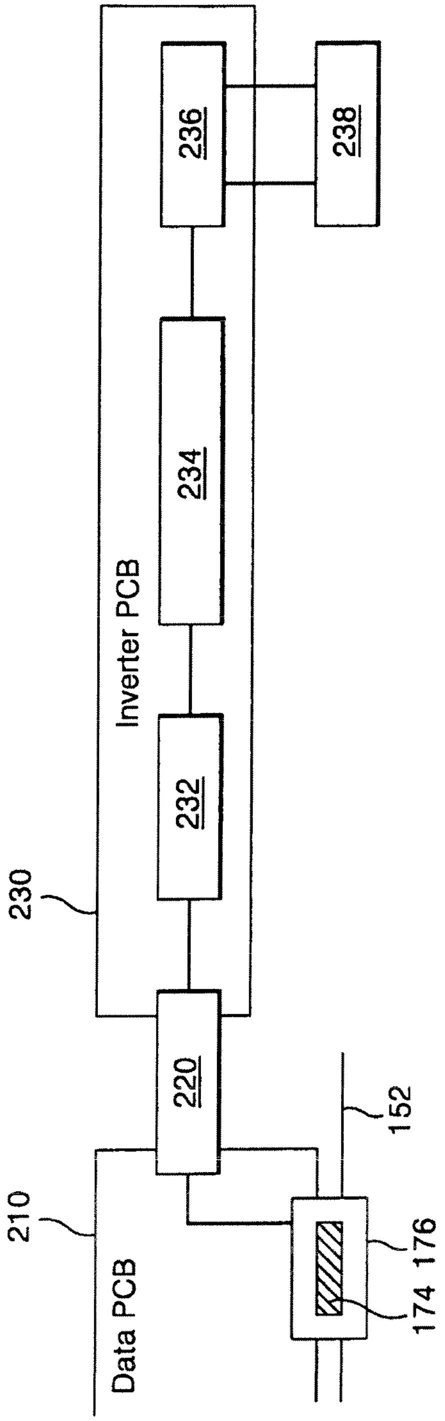
FIG. 7 is a diagram representing a driver of the liquid crystal display device and an inverter printed circuit board that drives a backlight of the liquid crystal display device.

FIG. 7 is a diagram representing an inverter printed circuit board which drives a driver and a backlight of the liquid crystal display device. The sensing voltage supplied to the first input pad 187*c*, as shown in FIG. 5, is transmitted to the inverter PCB 230 through a FPC (flexible printed circuit) (or connector) 220 which connects the data PCB 210 to the inverter PCB 230, as shown in FIG. 7. The inverter 230 converts the sensing voltage from the PCB 230 into a digital signal through an analog-digital converter ADC 232, and then supplies the digital signal to an inverter controller 234. The inverter controller 234 controls the inverter 236 that uses the digital signal corresponding to the sensing voltage supplied to the ADC 232. The inverter 236 controls the light output of the backlight 238 in response to the control signal from the inverter controller 234.

The inverter controller 234 can include a Look-up table for modulating the digital signal from the ADC 232. The inverter controller 234 compares the digital signal from the ADC 232 with a reference value and chooses the modulated digital signal corresponding to the compared result from the Look-up table, and then supplies the digital signal to the inverter 236 by use of the selected modulation digital signal. The inverter 236 controls the light output of the backlight 238 by use of the digital signal from the inverter controller 234.

Figure 8:
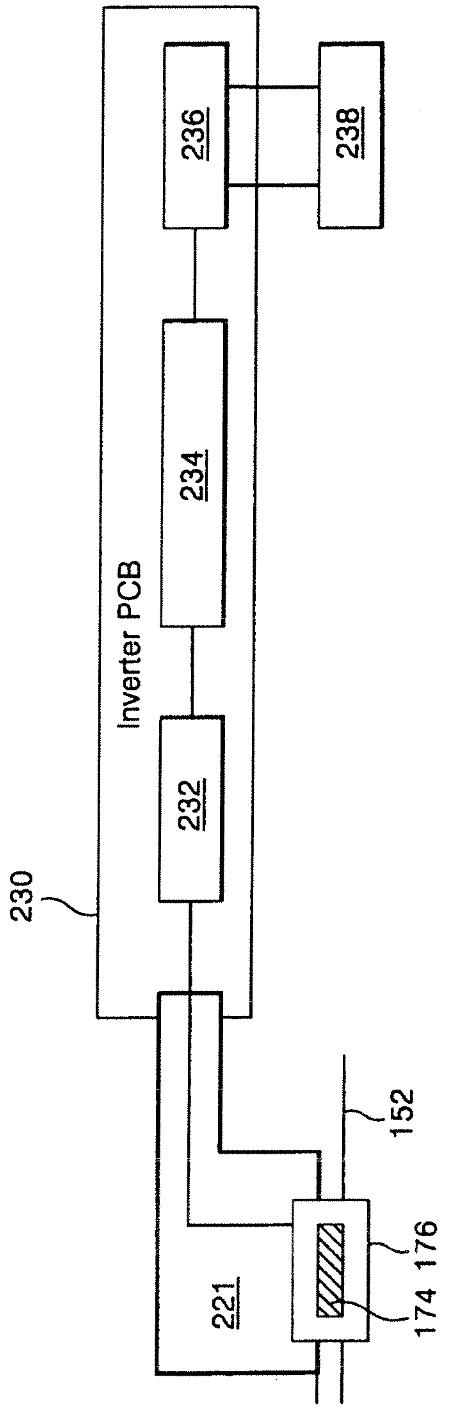
FIG. 8 is a diagram representing that a voltage sensed by a photo-sensing device is supplied to the inverter printed circuit board through an interconnection circuit.

FIG. 8 is a diagram representing that a voltage sensed by a photo-sensing device is supplied to the inverter printed circuit board through an interconnection circuit. The sensing voltage supplied to the first input pad 187*c* is directly transmitted to the inverter PCB 230, as shown in FIG. 8, by use of a flexible printed circuit (FPC) (or connector) 221. Thus, the sensing voltage does not pass through the data PCB.

Figure 9:
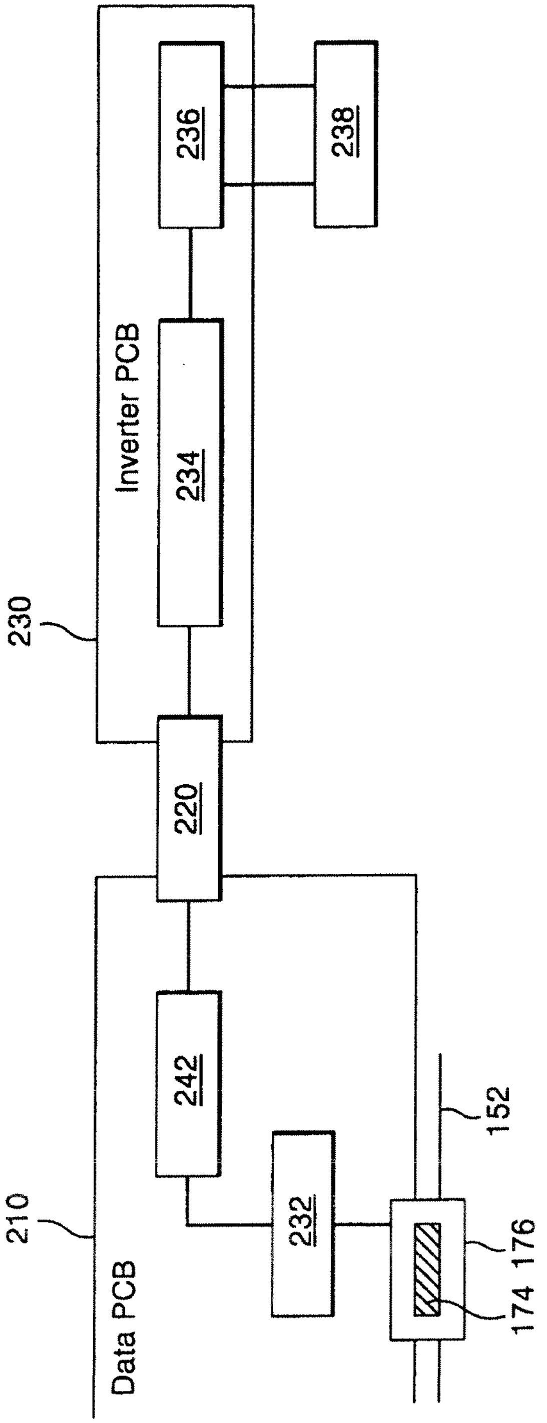
FIG. 9 is a diagram representing that the voltage sensed by the photo-sensing device is converted into and modulated a digital signal within a data printed circuit board, and then supplies the digital signal to the inverter printed circuit board.

FIG. 9 is a diagram representing that the voltage sensed by the photo-sensing device is converted into and modulated a digital signal within a data printed circuit board, and then supplies the digital signal to the inverter printed circuit board. A method of transmitting the sensing voltage supplied to the first input pad 187*c* to the inverter PCB is not limited to method described with regard to FIG. 7. For example, as shown in FIG. 9, the analog-digital converter ADC 232 is mounted on the data PCB 210 and a signal for controlling the backlight 238 is formed by use of a timing controller positioned on the data PCB 210. In other words, the sensing voltage supplied to the first input pad 187*c* is converted into the digital signal through the analog-digital converter ADC 232 positioned on the data PCB 210 and then supplies the digital signal to the timing controller 242. The timing controller 242 compares the digital signal from the ADC 232 with a reference value and chooses the modulated digital signal corresponding to the compared result from the Look-up table, and then supplies the selected modulation digital signal to the inverter 230 through the FPC 220. The inverter controller 234 and the inverter 236 of the inverter PCB 230 controls the light output of the backlight 238 by use of the modulated digital signal. Hereinafter, the light output from the backlight 238 is explained in reference with the characteristic of the thin film transistor.

Figure 10:
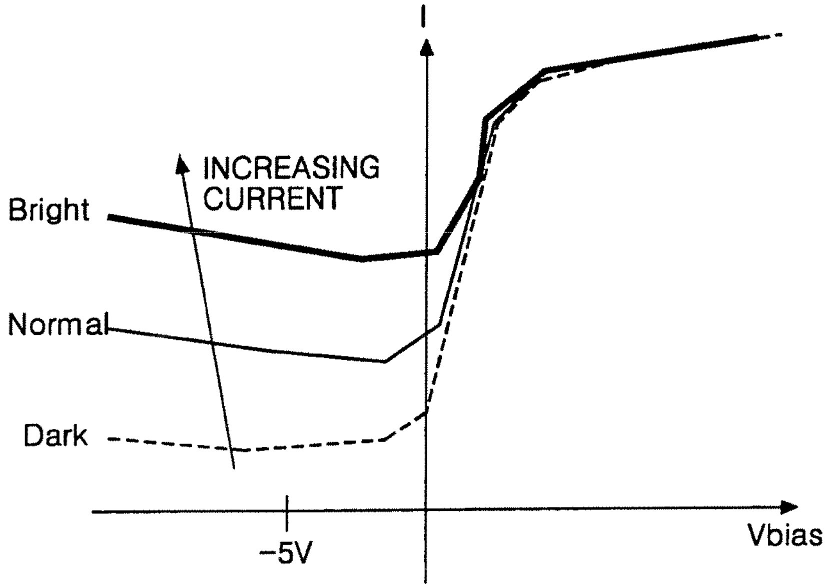
FIG. 10 is a diagram representing a driving characteristic of a photo-sensing device.

FIG. 10 is a diagram representing a driving characteristic of a photo-sensing device. The photo current (or "off" current) generated by the photo-sensing device 177, as shown in FIG. 10, becomes larger in size because the sensed light amount is larger as it goes from a dark environment to a bright environment. Accordingly, the light output of the backlight 238 is adjusted in proportion to the size of the current amount that is sensed by the photo-sensing device 177. For example, in the case of driving a transmissive liquid crystal display device in a bright environment where there is a lot of external light, the photo-sensing device 177 sense a large amount of light from the external light and controls the light output of the backlight 238 in accordance with the amount of sensed voltage. More specifically, a higher intensity light, which can make a displayed picture clearly visible in the bright environment, is supplied to the liquid crystal display panel 152 from the backlight 238, thereby improving visibility. In another example, in the case of driving a transmissive liquid crystal display device in the dark environment, the photo-sensing device 177 senses a small amount of light and the light intensity of the backlight 238 can be proportionally reduced in accordance with the amount of the sensed sensing voltage, thereby reducing power consumption.

On the other hand, in the case of using a transflective liquid crystal display device, rather than the general transmissive liquid crystal display device, a contrary method of light amount control is used. That is, in the case of the transflective display, a picture is realized by use of the external light in the bright environment so that the supply of the light from the backlight 238 is minimized and the supply of the light from the backlight 238 should be increased in an environment where the external light is low. Thus, in the case of driving a transflective liquid crystal display device in the bright environment where the external light is large, the photo-sensing device 177 senses a lot of light from the external light and the amount of the light supply of the backlight 238 is inversely proportional to the amount of the sensed sensing voltage, and the light supply of the backlight 238 is increased in the dark environment.

The liquid crystal display device according to embodiments of the present invention forms the photo-sensing device 177 within the liquid crystal display panel 152 and controls the brightness of the backlight 238 by use of a sense signal from the photo-sensing device 177. Accordingly, when the liquid crystal display panel 152 is located in a bright place, the light of the backlight 238 is adjusted to improve the visibility, and if the ambient brightness is dark, the light of the backlight 238 is reduced to lower power consumption. Further, the photo-sensing device 177 in the present invention can be simultaneously formed with the thin film patterns such as the thin film transistor 106*a* within the liquid crystal display panel 152, thus in comparison with the related art, the separate photo-sensing device 177 is not necessary to be added to the outside, thereby reducing manufacturing cost.

FIGS. 11A to 11E are process charts representing a fabricating process of a thin film transistor array substrate of a liquid crystal display device according to an embodiment of the present invention. Hereinafter, in reference with FIGS. 11A to 11E, a fabricating method of the thin film transistor array substrate 170 where the photo-sensing device 177 is formed on the liquid crystal panel will be described according to an embodiment of the present invention.

Figure 11A:
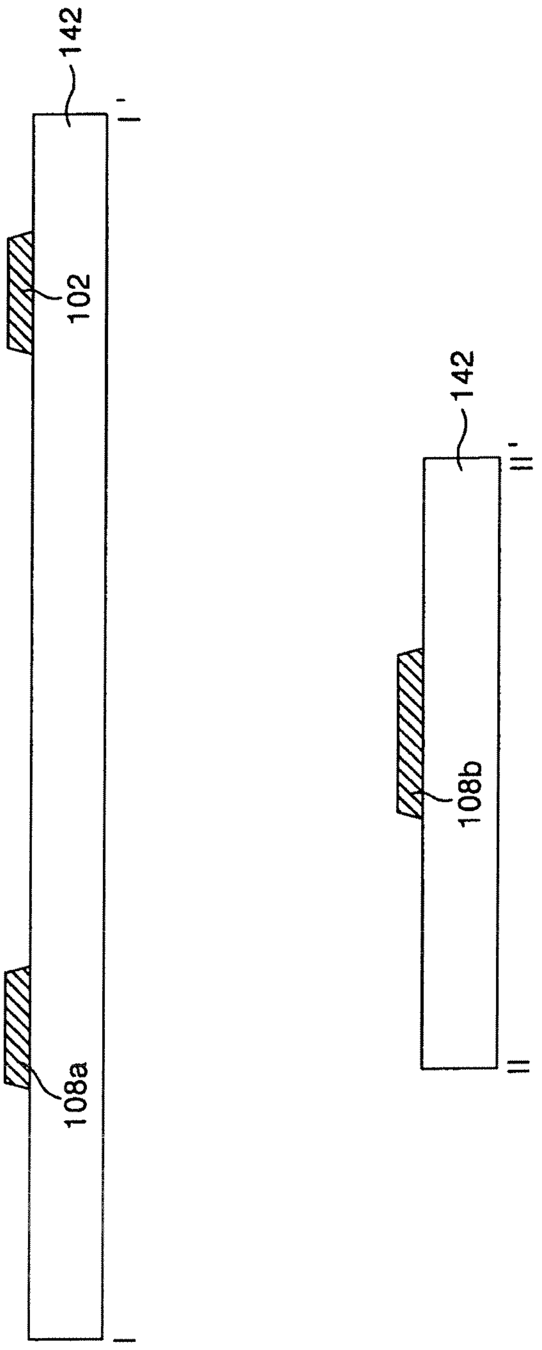
FIGS. 11A to 11E are process charts representing a fabricating process of a thin film transistor array substrate of a liquid crystal display device according to an embodiment of the present invention.
Figure 11B:
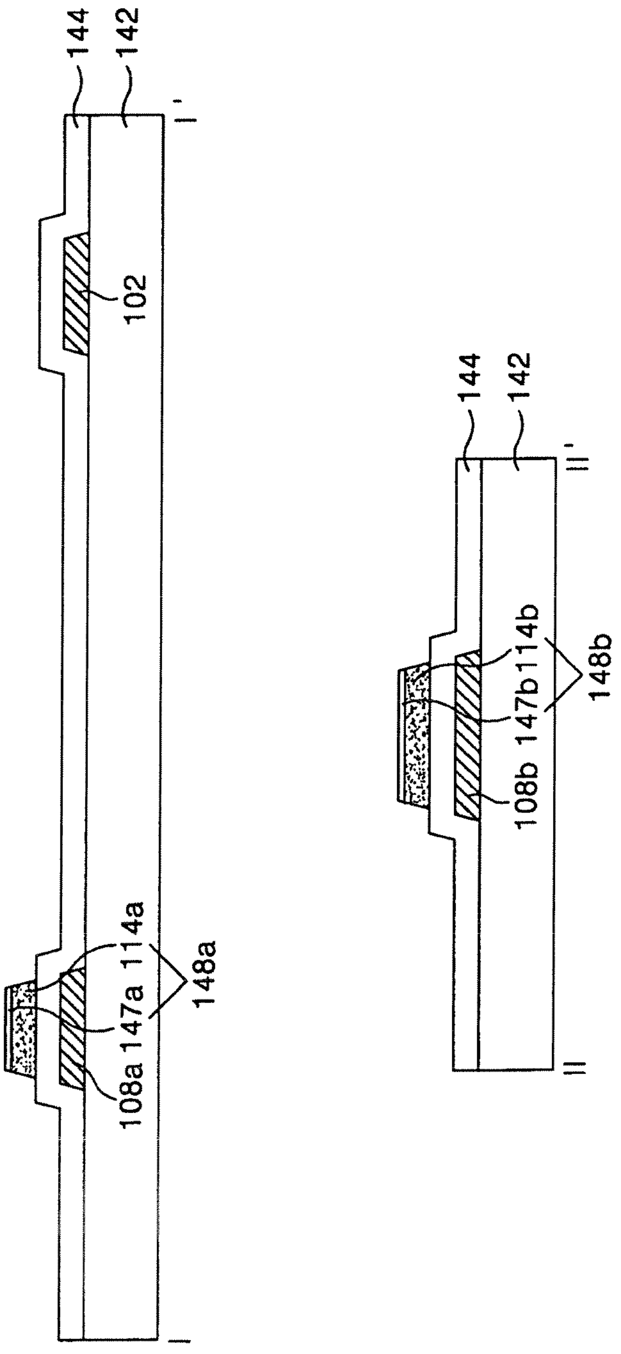

After a gate metal layer is formed on the lower substrate 142 by a deposition method, such as sputtering, the gate metal layer is patterned by a photolithography process and etching process, thereby forming the gate patterns having a first gate electrode 108*a* of the thin film transistor 106*a*, the gate line 102 in the display area P1, and the second gate electrode 108*b* of the photo-sensing device 177 in the non-display area P2, as shown in FIG. 11A. Then, the gate insulating film 144 is formed by the deposition method, such as PECVD or sputtering, on the lower substrate 120 where the gate patterns are formed. Subsequently, an amorphous silicon layer and n+ amorphous silicon layer are sequentially formed on the lower substrate 142 where the gate insulating film 144 is formed. The amorphous silicon layer and the n+ amorphous silicon layer are patterned by a photolithography process and an etching process using a mask, as shown in FIG. 11B, to form the first semiconductor pattern 148*a* for the thin film transistor 106*a* of the display are P1 and the second semiconductor pattern 148*b* for the photo-sensing device 177 of the non-display area P2. The first semiconductor pattern 148*a* is made of a double layer of the active layer 114*a* and the ohmic contact layers 147*a*. The second semiconductor pattern 148*b* is made of a double layer of the active layer 114*b* and the ohmic contact layers 147*b*.

Figure 11C:
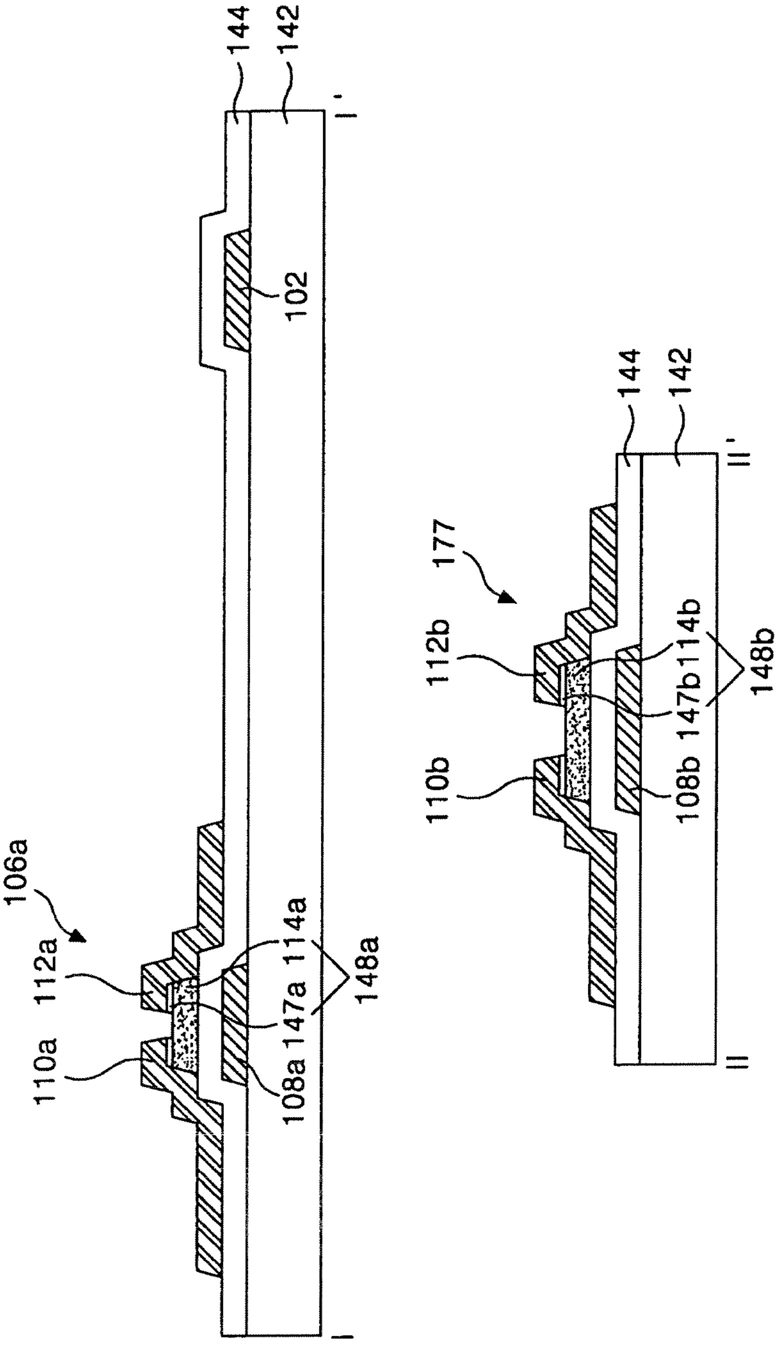

After sequentially forming a source/drain metal layer on the lower substrate 142 where the first and second semiconductor patterns 148*a* and 148*b* are formed, a source/drain pattern having the source line 181 and the drain line 183, the second source electrode 110*b* and the second drain electrode 112*b* of the photo-sensing device 177 is formed, the data line 104 is formed, and the first source electrode 110*a* and the first drain electrode 112*a* of the thin film transistor 106*a* is formed, as shown in FIG. 11C, by a photolithography process and an etching process using the mask.

Figure 11D:
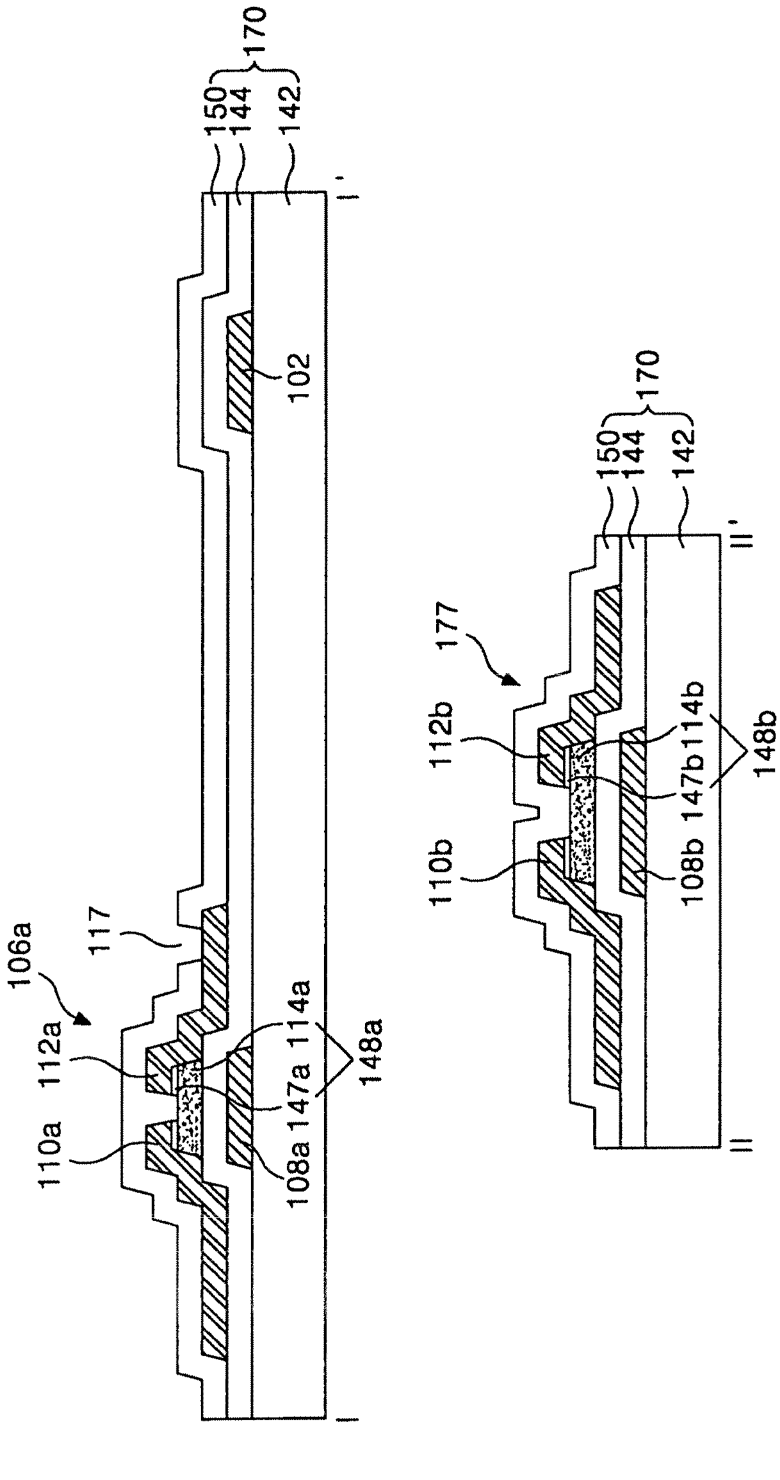

A passivation film 150 is formed by a deposition method, such as plasma enhanced chemical vapor deposition (PECVD), on the entire surface of the gate insulating film 144 where the source/drain patterns are formed. Then, the passivation film 150 is patterned by a photolithography process and an etching process to form a contact hole 117, which exposes the first drain electrode 112A of the thin film transistor 106A, as shown in FIG. 11D.

Figure 11E:
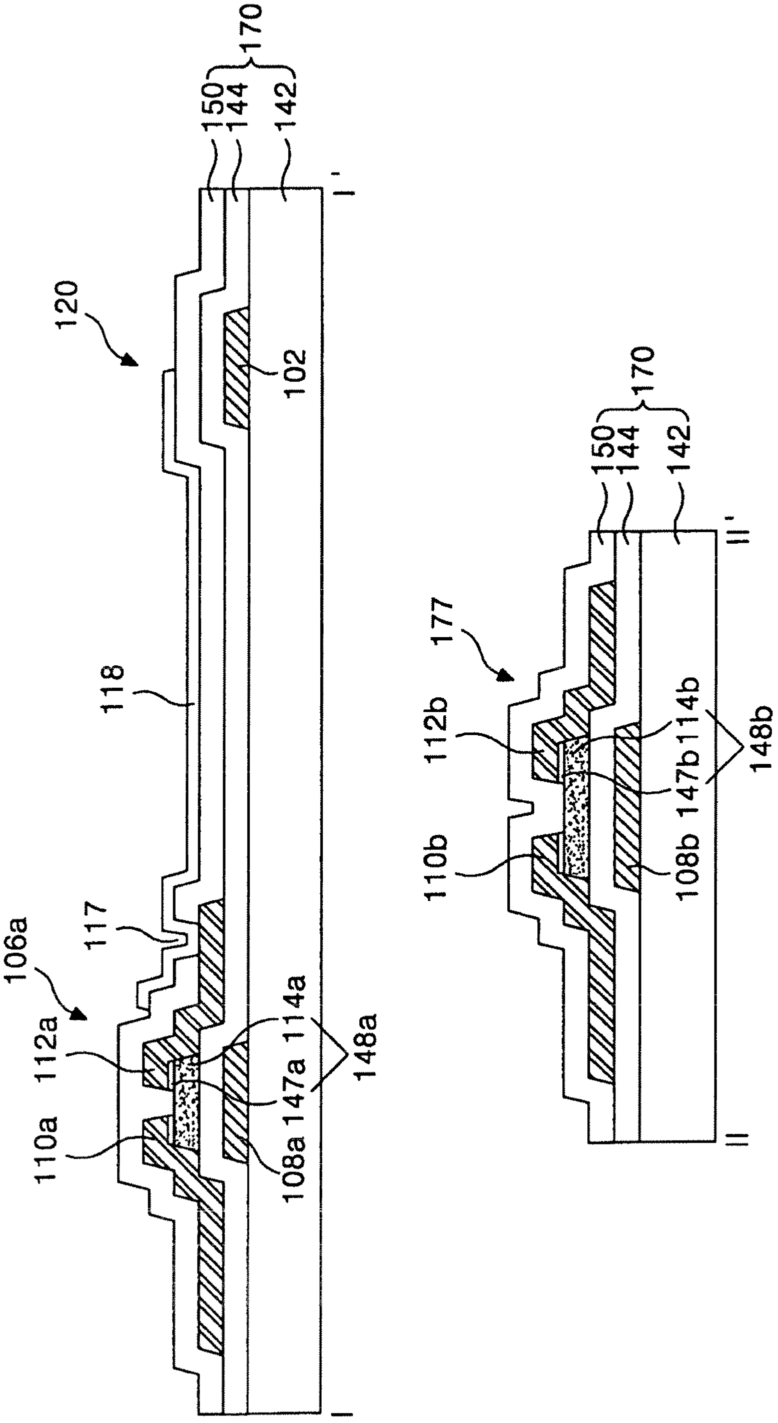

A transparent electrode material is deposited on the entire surface of the passivation film 150 by a deposition method, such as sputtering. Then, the transparent electrode material is patterned by a photolithography process and an etching process, thereby forming the pixel electrode 118, as shown in FIG. 11E. Accordingly, the thin film transistor arrays are formed in the display area P1 of the thin film transistor array substrate 170, and at the same time, the photo-sensing device 177 is formed in the non-display area P2.

The liquid crystal cell area on the color filter array substrate 180 is formed by a separate process. The color filter array substrate 180 has the black matrix 134 that prevents light leakage when driving the liquid crystal display device. The color filter array substrate 180 also has the color filter 136 formed in the liquid crystal cell area divided by the black matrix 134 and corresponding to the pixel area where the pixel electrode 118 is located. The black matrix 134 is not formed in an area corresponding to the pixel electrode 118*a* or in the light receiving area P3 of the photo-sensing device 177 in the non-display area P2. The thin film transistor array substrate 170 and the color filter array substrate 180 are bonded with liquid crystal therebetween, thereby completing the liquid crystal display panel 152 inclusive of the photo-sensing device 177.

Figure 12:
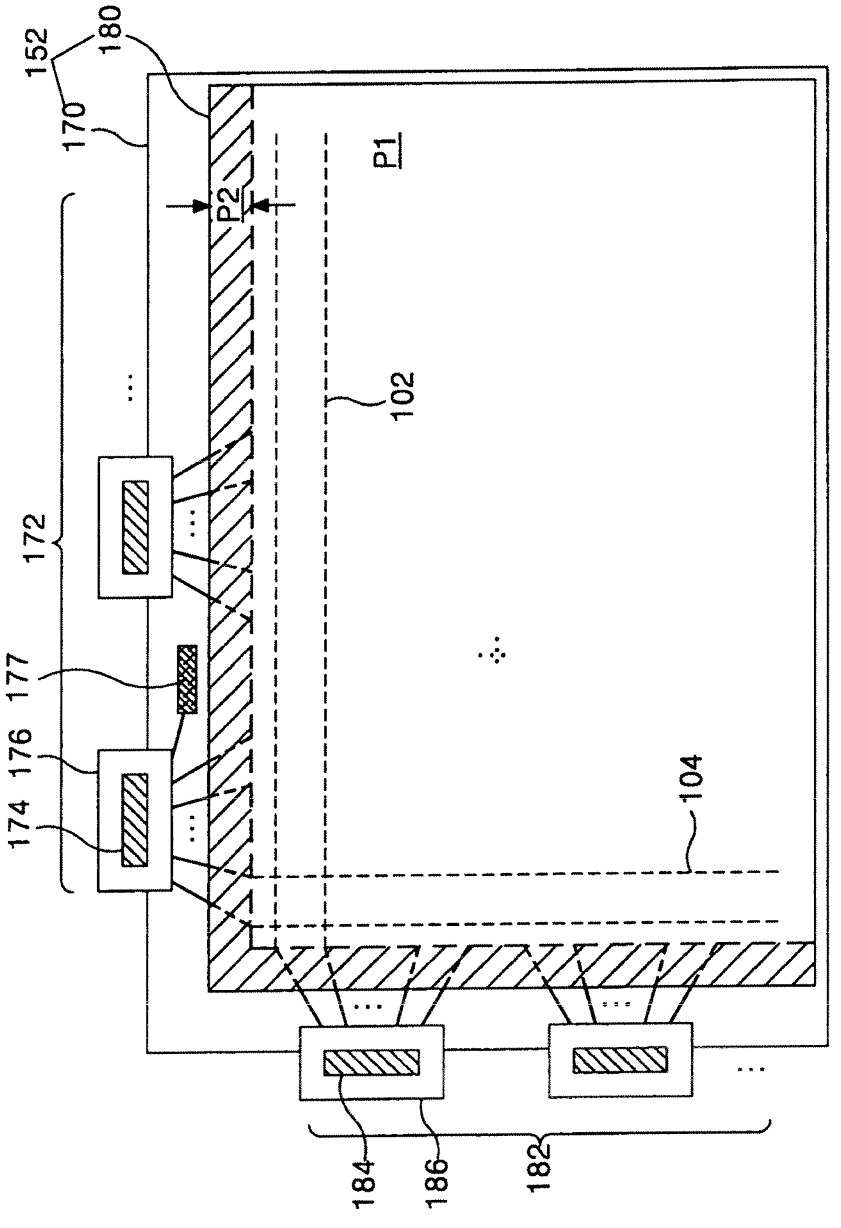
FIG. 12 is a diagram representing a liquid crystal display device according to a second embodiment of the present invention.

FIG. 12 is a plan view of a liquid crystal display device according to a second embodiment of the present invention. The liquid crystal display device shown in FIG. 10 has the same components as the liquid crystal display device according to the first embodiment of the present invention, as shown in FIGS. 2 to 6, except that the photo-sensing device 177 is positioned so as not to be covered by the color filter array substrate 180 but rather is exposed directly to the outside such that no separate light receiving area P2 is provided in the black matrix 134. Thus the same reference numerals are given to the same components as FIGS. 2 to 6 and a detail description will be omitted.

Referring to FIG. 12, in the second embodiment of the present invention, the photo-sensing device 177 is not covered by the color filter array substrate 180, so that the entire channel 151 area might be exposed to the external light. Accordingly, in case that the external light is incident to the photo-sensing device 177 in the second embodiment, external light does not pass through the color filter array substrate 180, thus the efficiency of the external light sensing is increased and the reliability of the sensed light can be improved. Further, in the first embodiment, the incident light supplied to the photo-sensing device 177 first passes through a polarizer that is located at the rear surface of the color filter array substrate 180. In the second embodiment, the incident light supplied to the photo-sensing device 177 does not pass through a polarizer, thereby making the photo-sensing more precise and reliable.

As described above, the liquid crystal display device and the fabricating method thereof according to embodiments of the present invention forms a photo-sensing device on the liquid crystal panel and controls the brightness of the backlight using a sensed signal from the photo-sensing device. Thus, in the case when a transmissive LCD device is located in a bright place, the light of the backlight is made bright to improve visibility, and if the ambient light is dark, the light of the backlight is made dark to reduce power consumption. Further, the photo-sensing device of the present invention is made to be simultaneously formed with the thin film patterns, thus the separate photo-sensor is not later added to liquid crystal panel like in the related art, thereby reducing manufacturing cost.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a liquid crystal display device, comprising:

forming a gate pattern having of a gate line and a first gate electrode of a first thin film transistor connected to the gate line in a display area of a thin film transistor array substrate and a second gate electrode of second thin film transistors in a non-display area of the thin film transistor array substrate;

forming a gate insulating film on the gate pattern;

forming a first semiconductor pattern of the first thin film transistor and a second semiconductor pattern of the second thin film transistors on the gate insulating film;

forming a source/drain pattern having a first source electrode and a first drain electrode of the first thin film transistor connected to the first semiconductor pattern, second source electrodes and second drain electrodes of the second thin film transistors connected to the second semiconductor pattern, and a data line crossing the gate line;

forming a passivation film having a contact hole that exposes the first drain electrode of the first thin film transistor;

forming a pixel electrode that is connected to the first drain electrode through the contact hole;

forming a color filter array substrate having a color filter array; and bonding the color filter array substrate and the thin film transistor array substrate with liquid crystal therebetween, a photo-sensing device being not overlapped by the color filter array substrate, wherein the photo-sensing device has a structure in which a plurality of parallel connected the second thin film transistors are configured to commonly share the second gate electrode, the second drain electrodes, the second source electrodes and the second semiconductor pattern such that channels acts as a light receiving part of the photo-sensing device, wherein the channels are formed between the second drain electrodes and the second source electrodes, wherein the second gate electrode is formed in a bar shape, and wherein the second source electrodes and the second drain electrodes are interleaved on the second gate electrode.

2. The fabricating method according to claim 1, wherein forming the color filter array substrate includes:

forming a black matrix in an area except an area corresponding to a pixel area and the channels of the photo-sensing device; and forming the color filter array in an area corresponding to the pixel area.

* * * * *